US008160858B2

(12) United States Patent (10) Patent No.: US 8,160,858 B2
Tseng et al. (45) Date of Patent: Apr. 17, 2012

(54) SYSTEMS AND METHODS OF EFFICIENT LIBRARY CHARACTERIZATION FOR INTEGRATED CIRCUIT CELL LIBRARIES

(75) Inventors: Ken Tseng, Cupertino, CA (US); Kevin Chou, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/970,912

(22) Filed: Dec. 16, 2010

(65) Prior Publication Data

US 2011/0087478 A1 Apr. 14, 2011

Related U.S. Application Data

(63) Continuation of application No. 11/943,529, filed on Nov. 20, 2007, now Pat. No. 7,937,256.

(51) Int. Cl.
*G06F 17/50* (2006.01)
(52) U.S. Cl. ............................................. 703/14; 703/13
(58) Field of Classification Search .................... 703/13, 703/14; 716/4, 5, 6, 109
See application file for complete search history.

(56) References Cited

U.S. PATENT DOCUMENTS

2002/0042704 A1* 4/2002 Najm et al. ..................... 703/14

OTHER PUBLICATIONS

R. D. Freeman et al., "Automated Extraction of SPICE Circuit Models from Symbolic Gate Matrix Layout with Pruning", 1986, IEEE, pp. 418-424.*
Emrah Acar et al., "Leakage and Leakage Sensitivity Computation for Combinational Circuits", 2003, ACM, pp. 96-99.*
Luis Guerra e Silva et al., "Algorithms for solving Boolean satisfiability in combinational circuits", 1999, ACM, pp. 1-5.*
Dan Souder et al., "JSPICE: a component-based distributed Java front-end for SPICE", 1998, Concurrency: Practice and Experience, pp. 1131-1141.*

* cited by examiner

*Primary Examiner* — Paul Rodriguez
*Assistant Examiner* — Luke Osborne
(74) *Attorney, Agent, or Firm* — Holland & Knight LLP; Brian J. Colandreo, Esq.; Mark H. Whittenberger, Esq.

(57) ABSTRACT

A method of efficient library characterization of a circuit of a logic gate having a plurality of transistors and a plurality of nodes defining interconnection points in the circuit is disclosed. The method includes determining a plurality of vectors for a plurality of arcs. Each of the plurality of vectors represents possible data bits to inputs and nodes of the logic gate. The method performs circuit pruning for each of distinct vectors. The circuit pruning includes identifying an active circuit for each vector. Then, the circuit simulations limited to a plurality of transistors in the active circuit are performed. The circuit pruning and circuit simulations are repeated for remaining ones of the plurality of substantially distinct vectors. The results of the circuit simulations are then stored on a non-volatile compute readable media, for each active circuit corresponding to each of the plurality of substantially distinct vectors.

16 Claims, 10 Drawing Sheets

Simple buffer with random threshold voltage variations

Figure 7A

| | Nominal | d(Vthn1) | d(Vthp1) | d(Vthn2) | d(Vthp2) | sigma |
|---|---|---|---|---|---|---|
| Delay | 97ps | 7.3ps | 0.04ps | 0.24ps | 3.6ps | 8.1ps |
| Input Pin Cap | 3.3fF | 0.07fF | 0.04fF | 0 | 0 | 0.08fF |

SYSTEMS AND METHODS OF EFFICIENT LIBRARY CHARACTERIZATION FOR INTEGRATED CIRCUIT CELL LIBRARIES

CLAIM OF PRIORITY

This application is a continuation of prior application Ser. No. 11/943,5294, now U.S. Pat. No. 7,937,256 filed on Nov. 27, 2007, from which priority under 35 U.S.C. §120 is claimed. The disclosure of this Application is incorporated herein by reference.

BACKGROUND OF THE INVENTION

Embodiments generally relate to the creation of integrated circuit electrical models for analysis and optimization of integrated circuit design and fabrication.

Library characterization is a necessary and well-defined step during the design of an integrated circuit. It extracts the electrical behavior and functional model of every logic gate in a cell library, given their transistor level circuitry and manufacturing process models. However, library characterization is also a very compute intensive process, often requiring hundreds of computers running a characterization program in parallel, over duration of many weeks, in order to generate a complete set of library. Recent design methodologies require even more variants in a cell library, in terms of process, supply voltage and temperature variations, resulting in even longer runtime durations and larger compute farms. This ultimately leads to delaying the integrated circuit design schedule.

It is within this context that embodiments of the invention arise.

SUMMARY OF INVENTION

Broadly speaking, the present invention fills these needs by providing an efficient library characterization method with consideration for process variations for the creation of electrical models to optimize integration circuit fabrication. It will be obvious, however, to one skilled in the art, that the present invention may be practiced without some or all of these specific details. In other instances, well known process operations have not been described in detail in order not to unnecessarily obscure the present invention.

In one embodiment, a method of efficient library characterization of a circuit of a logic gate having a plurality of transistors and a plurality of nodes defining interconnection points in the circuit is disclosed. The method includes (a) determining a plurality of vectors for a plurality of arcs, each of the plurality of vectors represents possible data bits to inputs and nodes of the logic gate, (b) selecting a plurality of substantially distinct vectors from the plurality of vectors for each of the plurality of arcs, and (c) performing circuit pruning for each of the plurality of substantially distinct vectors taking each one substantially distinct vector at a time, the circuit pruning includes identifying an active circuit for each vector. The active circuit is identified by determining which circuit features are activated when applying a particular one of the substantially distinct vectors. The method further includes (d) performing circuit simulations limited to a plurality of transistors in the active circuit, and (e) repeating (c) and (d) for remaining ones of the plurality of substantially distinct vectors. The results of the circuit simulations are then stored on a non-volatile compute readable media, for each active circuit corresponding to each of the plurality of substantially distinct vectors.

In another embodiment, a method of efficient library characterization of a cell library including a plurality of logic gates, each of the plurality of logic gates including a plurality of transistors is disclosed. The method includes (a) determining a plurality of vectors for a plurality of arcs, each of the plurality of vectors represents possible data bits to inputs and nodes of the logic gate, (b) selecting a plurality of substantially distinct vectors from the plurality of vectors for each of the plurality of arcs, and (c) performing circuit pruning for each of the plurality of substantially distinct vectors taking each one substantially distinct vector at a time, the circuit pruning includes identifying an active circuit for each vector. The active circuit is identified by determining which circuit features are activated when applying a particular one of the substantially distinct vectors. The method further includes (d) performing circuit simulations limited to a plurality of transistors in the active circuit to identify ones in the plurality of transistors that exhibit an influence that is below a threshold value, the threshold value being provided by a user, and (e) performing a sensitivity analysis limited to the ones in the plurality of transistors that exhibit an influence that is below a threshold value. The sensitivity analysis includes performing a circuit simulations on a subset of an entire process variation range for determining the influence on transistors limited to the ones in the plurality of transistors that exhibit an influence that is below a threshold value and calculating the influence on transistors limited to a plurality of transistors in the active circuit of remaining process variation range using a response surface method (RSM). The method also includes (f) repeating (c) and (e) for remaining ones of the plurality of substantially distinct vectors, and (g) storing results of the circuit simulations on a non-volatile compute readable media, for each active circuit corresponding to each of the plurality of substantially distinct vectors.

In yet another embodiment, an apparatus for performing an efficient library characterization process on a circuit of a logic gate having a plurality of transistors and a plurality of nodes defining interconnection points in the circuit is disclosed. The apparatus includes a module to read process models that describe process variations data, the process models being used to predict influence on switching characteristics through circuit simulations and a Response Surface Method (RSM). A module is included to enable a user to input user commands, and a module is included to determine a plurality of arcs. Each of the plurality of arcs represents an input-to-output path pair in the logic gate. The method further includes determining a plurality of vectors for each of the plurality of arcs where each of the plurality of vectors represents a possible input data bits to inputs and the plurality of nodes. The apparatus further includes a module to perform circuit pruning process, and the circuit pruning process includes identifying active portions of the circuit, the active portions being portions of the circuit that affect circuit performance. The circuit simulation is run to predict process variation influence on a switching characteristic on a plurality of transistors in the pruned circuit.

In yet another embodiment, a computer implemented method for an efficient library characterization process for a circuit of a logic gate having a plurality of transistors and a plurality of nodes defining interconnection points in the circuit is disclosed. The computer implemented method includes performing an automatic arc and vector determination, the automatic arc and vector determination includes exhaustively testing all input-outputs of a logic gate for a plurality of rising and falling signal combinations and eliminating one or more of the plurality of rising and falling signal combinations if the one or more of the plurality of rising and falling combinations do not conform with a logic of true logic gate. The arc represents an input-to-output pair in the logic gate and a vector represents possible input data bits to inputs and nodes of the logic gate. The method further includes performing activity based circuit pruning, the activity based circuit pruning include identifying active portions of the circuit that impact the performance of the circuit, determining a magnitude of an electrical influence of a process parameter variation on each of a plurality of transistors in the active portions of the circuit, and invoking circuit simulations to predict the electrical influence of a plurality of process parameter variations on a switching characteristic of each of the plurality of transistors in the active portions of the circuit. If the magnitude of the electrical influence is below a selectable threshold, the plurality of process parameter variations include only a subset of entire process parameter variation range, the electrical influence of remaining process parameter variation range being calculated through a Response Surface Method (RSM).

Library characterization process is a very compute intensive process involving hundreds of machines running SPICE simulations continuously and in parallel, over the duration of weeks or even months. The advantages of the present invention are numerous. Most notably, the apparatus and methods described herein provide regular and statistical library characterization to increase the speed and accuracy of the computation of library characterization.

Other aspects and advantages of the embodiments of the present invention will become apparent from the following detailed description, taken in conjunction with the accompanying drawings, illustrating by way of example the principles of the present invention.

BRIEF DESCRIPTION OF DRAWINGS

The present invention will be readily understood by the following detailed description in conjunction with the accompanying drawings. To facilitate this description, like reference numerals designate like structural elements.

The figures are provided in order to provide a thorough understanding of the present invention. The figures should not be construed as limiting the breath of the invention in any manner.

DETAILED DESCRIPTION

Methods and apparatus for efficient library characterization are disclosed. In the following description, numerous specific details are set for the in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Statistical static timing analysis (SSTA) is a type of statistical analysis of integrated circuits that provides a more realistic estimation of timing relative to actual silicon performance, often reducing worst-case timing margins by 10-15%, resulting in a higher yielding design that can be taped out sooner. To accurately predict variation, SSTA needs variation aware timing models that account for both systematic process variations (e.g. variations due to lithography) and random process variations (e.g. variations due to doping).

These models are created for consumption by SSTA by characterizing each cell for any given set of process parameter variations where the amount of variation is based on actual process measurements. Parameter variations can be treated as uncorrelated or correlated. Uncorrelated parameter sets are characterized independently while correlated parameter sets are characterized together.

For systematic inter-cell variation the process varies in the same direction by the same amount for each transistor inside a cell. Systematic variation can be used to model both on chip and off chip variation. Random intra-cell variation models the process variations that apply to each transistor independently (also known as mismatch).

Traditional library characterization processes are very compute intensive involving hundreds of machines running circuit simulations continuously and in parallel, over the duration of weeks or even months. Statistical characterization substantially increases the required amount of computation.

Further, the computing intensity increases with the increase in the number of transistors in the circuits. The embodiments describes herein substantially reduce the computing intensity by the use of circuit pruning and reducing the simulations by identifying the transistors with linear or small influences of the process variations. In one embodiment, "small" is defined by a user selectable value of the magnitude of the influence. With this overview in mind, the following figures will illustrate example structure and functionality of a module board and related components.

Embodiments of the present invention use circuit simulations. The circuit simulations are generally used to predict the effect of variations of component manufacturing tolerance values. There are various circuit simulators currently available in the market. Simulation Program with Integrated Circuit Emphasis (SPICE) is one of the many available circuit simulators. SPICE is a general purpose analog circuit simulator. It is a powerful program that is used in IC and board-level design to check the integrity of circuit designs and to predict circuit behavior. It is well known that the performance of a component in the circuit is affected by component manufacturing tolerances. It may be noted that the embodiments described herein may be practiced with SPICE or any other comparable circuit simulator.

Figure 1A:
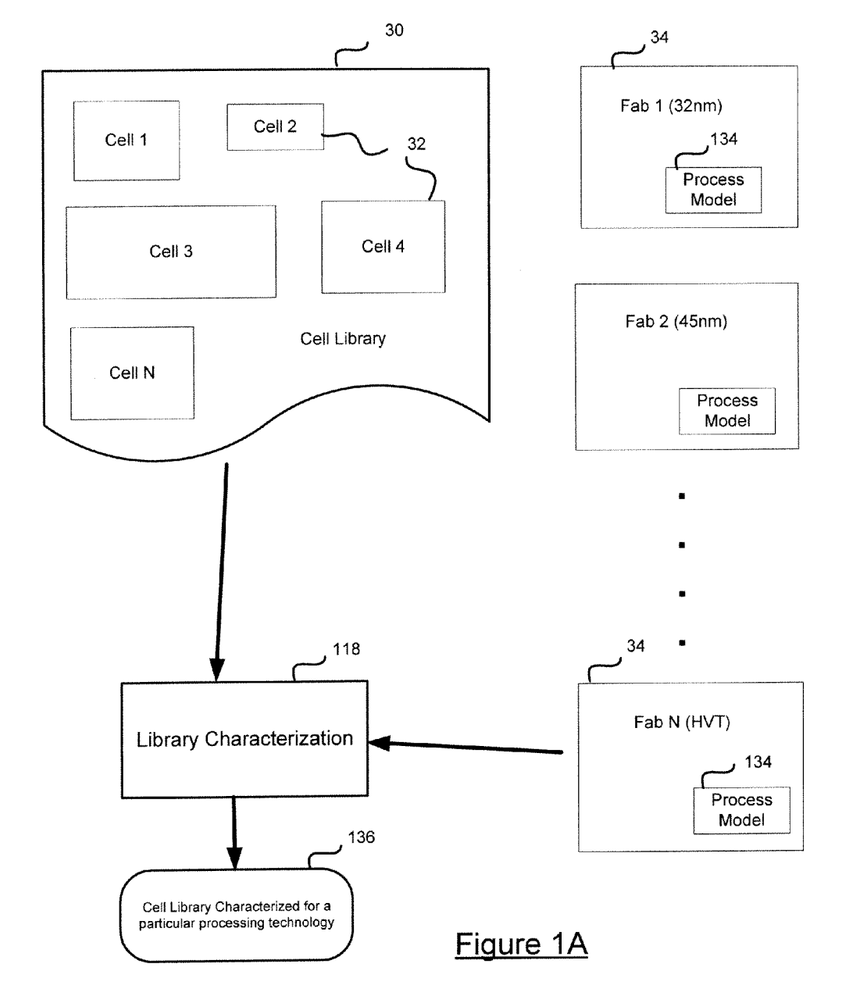
FIG. 1A illustrates a broad overview of transforming a cell library including cell definitions into a cell library that is customized for a particular IC fabrication facility, in accordance with one embodiment of the invention.

FIG. 1A illustrates an overview of the process of efficient library characterization. Cell libraries 30 that include definitions of cells 32 (or logic gates) are used for generating IC layouts for the fabrication of the integration circuits. However, these definitions of the cells 32 does not account for the process variations. The process variations differ due to the use of different semiconductor fabrication processing technologies (such as 32 nm, 45 nm, 65 nm, 90 nm, High Threshold Voltage (HVT), Low Threshold Voltage (LVT) processing and design technologies) by different fabs, (or within the same fab due to manufacturing variations). The embodiments of the library characterization methods and systems disclosed herein transform the input cell library 30 into a cell library that is customized for a process technology in one embodiment. The fab 34 provides process model 134 that includes various process parameters and their respective manufacturing tolerance values. The library characterization system 118 changes the cell library 30 into a form 136 characterized for process technologies. The characterized cell library 136, in one embodiment, is stored on a computer readable media. In one embodiment, a cell library characterized for a particular processing technology can be used by different fabs as differing manufacturing tolerances between fabs (or within the same fab) can be modeled in the characterized cell library.

Figure 1B:
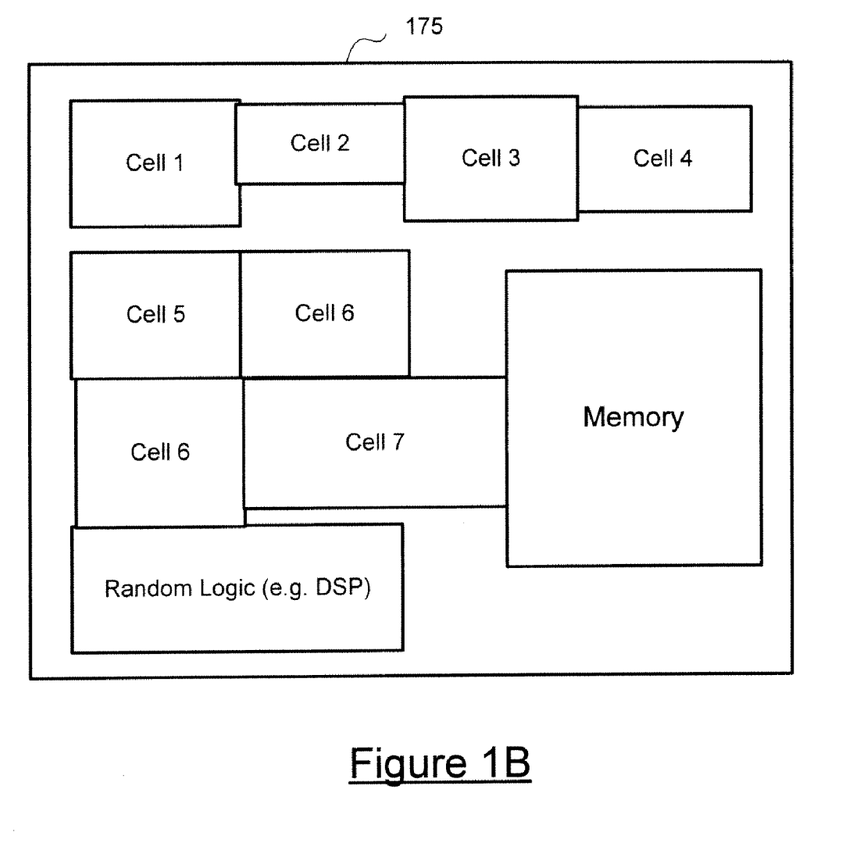
FIG. 1B illustrates an exemplary semiconductor chip including cells, memory and random logic, in accordance with one embodiment of the present invention.

FIG. 1B illustrates an exemplary semiconductor chip 175 block diagram. The chip includes cells, memory, and random logic (e.g., Digital Signal Processor (DSP), processors, etc.). The embodiments described herein perform analysis within the cell level. The embodiments can also analyze memory cells and random logic such as processors.

Figure 2:
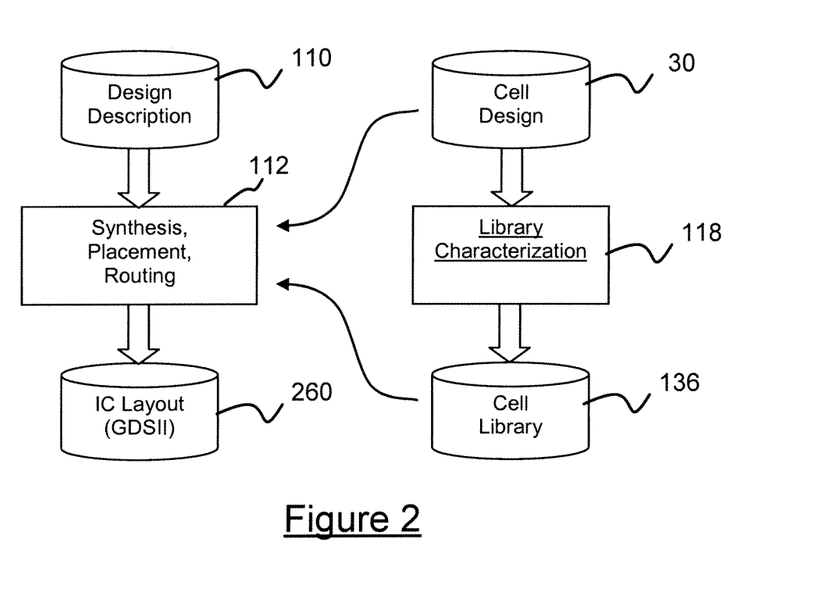
FIG. 2 illustrates an exemplary process flow for the manufacturing of IC Layouts using cell design and cell libraries, in accordance with one embodiment of the invention.

FIG. 2 illustrates a process flow diagram for creating IC layouts 260. Library characterization 118 is a process that extracts the electrical and logical behavior from a transistor level circuit into abstract models of timing, power, noise and logic function. The circuit may be a logic gate, a memory element, or a custom block of circuitry such as a processor core. In one embodiment, the circuit is represented in a SPICE format. In other embodiments, other formats can be used depending upon a use of a particular circuit simulator. The extracted model, commonly known as a characterized cell library 136, is a necessary component in the integrated circuit design flow. The IC design flow begins with a high-level description of the design 110, which is processed by a synthesis, placement and routing system (SP&R) 112 that generates the physical layout for the manufacturing of the design. The physical model of the cells (i.e., cell design 30) is provided to the SP&R 112 to optimally place and connect each of the instantiation of these cells together to form the optimally small integrated circuit. The functional model of the cell library 136 is also provided to the SP&R 112 to synthesize a functionally correct design. Further, the electrical model is also inputted to the SP&R 112 to optimize the design for timing, power and noise requirements.

Figure 3:
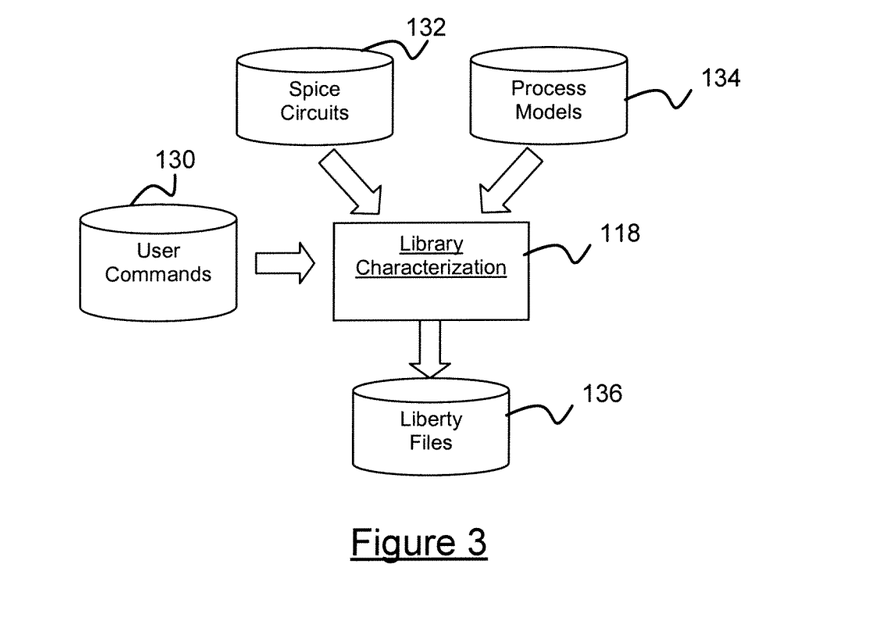
FIG. 3 illustrates an exemplary process flow of the creation of characterized model using efficient library characterization methods, in accordance with one embodiment of the invention.

The inputs and outputs of the library characterization process 118, in one embodiment, are illustrated in FIG. 3. The inputs include the SPICE circuit 132 of each of the cells 32 (i.e., logic gates) in the cell library 30, the process model 134 of the manufacturing process, and a set of user commands 130. The outputs include the electrical and functional model of each of the cells in the cell library. In one embodiment, the output file (i.e., the characterized cell library file 136) is represented in the Liberty™ file format and its extensions. In other embodiments, the output file can be represented in other file formats such as Advance Library Format, Timing Library Format, etc. In one embodiment, the user commands typically include process conditions, supply voltage, ambient temperature, as well as various control settings. In one embodiment, the output cell library file 136 can contain timing, power, noise, pin capacitance, as well as variation of these data due to process, voltage and temperature.

The library characterization steps are performed multiple times to capture the correct electrical behavior at unique process conditions, supply voltages and ambient temperatures. Each of these unique conditions is represented by a unique cell library file 136. It may be noted that the Liberty™ file format is an industry standard to for storing electrical behavior of circuit components, however, the term is being used herein for example only. The embodiments described herein can be practices without a use of the Liberty™ file format.

Figure 4:
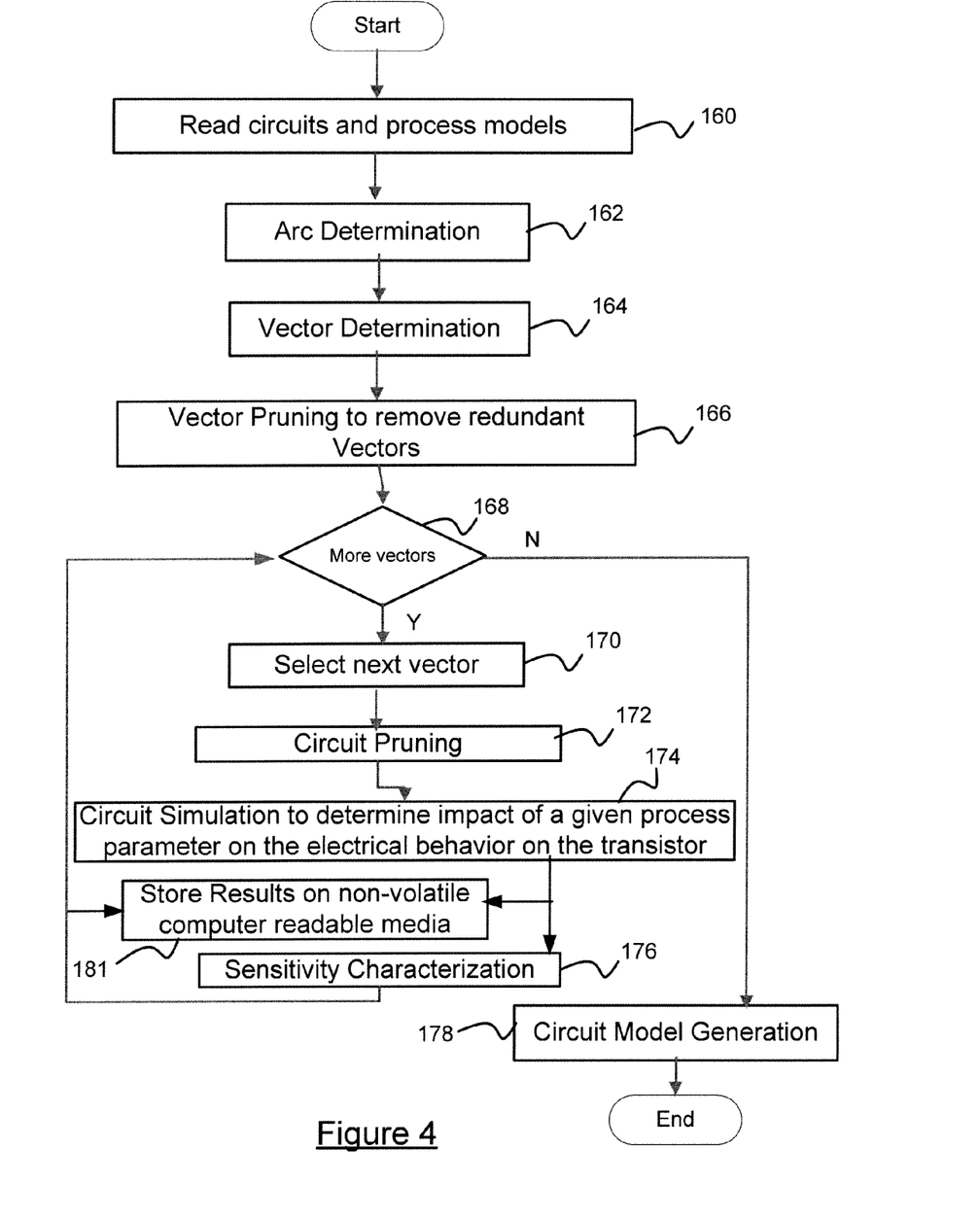
FIG. 4 illustrates a flow diagram for the method of library characterization, in accordance with one embodiment of the present invention.

FIG. 4 illustrates a flow diagram for generating electrical models for specific process conditions. The process of generating electrical models for specific process conditions starts by reading cell library for each logic gate (i.e., cell) and manufacturing process models in operation 160. The input models describe the electrical behavior of each transistor in the circuit. The input model is stored in internal data structures with transistor terminals and their connectivity between each other, as well as the primary inputs and outputs of the logic gate or cell. The control moves to operation 162 in which input-to-output arc for each logic gate in the circuit. Timing constraint arcs between regular primary inputs and clock inputs are also identified. An input-to-output arc is defined as input-output pair (+rise/fall directions) in a logic gate. For example, a two input AND gate would have four arcs and an inverter would have two arcs. Following table exemplarily illustrates the input-output arcs of an inverter (A-input, Y-output):

| A rise | Y fall |
| A fall | Y rise |

It may be noted that there arcs could be of different types such as input-to-output arc, timing arc, power consumption arc, input-to-input arc. In one embodiment, term "arc" describes an "input-to-output" or "input-input" arc. In another embodiment, an arc can also define data-clock pair for timing constraint.

Next in operation 164, all possible vectors are determined for each of the arcs. The vectors are determined by traversing the transistor level circuitry to derive a logic function that results in any given node being logic "1" with connection to power supply (i.e., Vdd), or being logic "0", with connection to the ground node. A node is defined as an internal connection between two or more transistors inside a logic gate.

Further, the vectors represent all possible data bit combinations to the inputs and storage nodes of the logic gate.

Still referring to operation 164. In one embodiment, the vectors are generated automatically by exhaustively attempting to test all input-output rising/falling combinations. For example, if a cell or a logic gate has inputs A and B, and output Y, following eight combinations are possible:

| | |
|---|---|
| A rise | Y rise |
| A rise | Y fall |
| A fall | Y rise |
| A fall | Y fall |
| B rise | Y rise |
| B rise | Y fall |
| B fall | Y rise |
| B fall | Y fall |

Some of these combinations may not be valid due to being contrary to the logic function of the logic gate. However, through this trial-and-error process, all possible arcs are captured. Further, for each arc, all possible vectors that support the arc are also captured.

The logic equation for each circuit node is represented as a binary decision diagram (BDD) of other nodes in the circuit such that the mutual logic relationship of the nodes can be represented in the equation form. Further, the logic equations for all circuit nodes are combined together to represent the total logic relationship between all circuit nodes. This BDD representation of the circuit is performed for each "possible" input-to-output arc during the automatic arc determination operation. In this BDD, there may be one or more vectors that satisfy the logic condition of the arc. All the vectors that satisfy the logic condition of the arc are exhaustively enumerated from the combined BDD.

The control then moves to operation 166 in which redundant vectors are identified. Every input-to-output arc can have one or more vectors that can satisfy the logic condition of the arc. In one embodiment, the vector redundancy is identified by monitoring pull-up (i.e., rising voltage level) and/or pull-down (i.e., falling voltage level) on various nodes in the arc when the vectors of the arc are applied one by one sequentially. If the pull-up/pull-down is same or substantially same for two vectors, one of the vectors is redundant. This process is repeated for vectors of every arc for the cell. Of course, if an arc has only one vector, this process of identifying redundant vectors is not performed on that arc. The redundant vectors are removed from further analysis purposes.

The control moves to operation 168 in which a number of remaining vectors for all arcs (as determined in operation 162) in the cell being analyzed is determined. If the number is greater than one, then the control moves to operation 172 in which one vector is selected from the remaining vectors. The control then moves to operation 172 in which a process of circuit pruning is performed. The term "circuit pruning" is broadly defined as identifying part or parts of the circuit of the cell that affect the performance of the circuit for the selected vector, and considering the transistors only in these part or parts of the circuits for further analysis. In one embodiment, the circuit pruning is performed by applying the selected vector and monitoring sensitization of the circuit nodes. The parts of the circuit that are not sensitized by the vector are not considered (i.e., pruned away) for further analysis.

In another embodiment, an "activity based" circuit pruning is employed to identify a subset of the circuitry and to run the simulation only on the subset of the circuitry to speed up the simulation. The "activity-based" circuit pruning automatically identifies the inactive portions of the circuit. The inactive portions of the circuit the portions of the circuit that do not impact the performance of the circuit; hence they can be pruned away before invoking circuit simulation. In one embodiment, to identify inactive portions, a single circuit simulation is performed to capture switching behavior of all circuit nodes. Then, inactive nodes (i.e., the nodes at which no change of electrical state is noticed) are identified and marked through circuit tracing. In one embodiment, nodes are defined as interconnection points in the circuit.

In this embodiment, the inactive portions of the circuit are identified by, starting from each switching primary input, searching all active wires by propagating forward until a primary output or an inactive wire is reached. A supply wire is considered an inactive wire. All transistors connected to an active wire, either through the source, drain or gate terminals, are marked as "active". If an active wire connects to a transistor channel, then search through the other channel terminal. If an active wire connects to a transistor gate, then search through both the source and the drain terminals of the transistor. The searching continues until an inactive wire is reached. When the active wire search finishes, all active transistors have been marked. Further, "heavily capacitively coupled" wires (for example, adjacent bit lines of a memory need to be considered in the process of finding active/inactive portions of the circuit. If an active wire is capacitively coupled (beyond a certain threshold, e.g., 100 fF) to another wire that is inactive, then the inactive wire must be re-labeled as active, and the associated pull-up or pull-down stack (transistors and wires) must be marked as active to account for "soft-grounding" effect on timing. For each transistor terminal connecting to an inactive wire, that wire is replaced by a voltage source. The voltage value can be extracted from the single circuit simulation run.

Next, operation 174 is performed, in which the circuit simulated is conducted on all transistors in the pruned circuit. For circuit simulation, the pruned circuit is written to a circuit simulation file for characterization, and the file is inputted to the circuit simulator to determine impact of a given process parameter on the electrical behavior on each of the transistors in the pruned circuit. The writing process preserves the parasitics on all active wires, with coupling capacitance to inactive wires replaced by grounded capacitance. Library characterization requires many invocations of circuit simulation, one for each measurement of timing, power and noise of each input-to-output arc, for a particular vector, and for a particular cell in the library. In one embodiment, each invocation of a circuit simulator involves submitting the circuit simulator run to a job queuing system, license checking, circuit parsing, the actual simulation, and then writing and reading files over a network of computers. There is significant performance overhead beyond the useful work performed by the circuit simulator. Various grouping techniques can be used to collect multiple similar simulations together into the same circuit "deck" (i.e., input feed to the circuit simulation engine) to reduce the number of circuit invocations. Even then, the number of circuit jobs typically number in the tens to hundreds of thousands for a single library.

To reduce the circuit simulation overhead, in one embodiment, a tight integration with a circuit simulator through a low level application programming interface (API) is provided. One example of the low level API is C programming language API to the circuit simulator engine. The low level API provides an efficient access to the circuit simulator due to low computational overheads. The circuit parsing is performed once and re-used many times. The circuit "deck" is written directly to the circuit simulator, and the results read directly from it, without incurring any hard disk and network traffic overhead or routing the data through other layers of the operating system. Further, in one embodiment, license checking is eliminated from each circuit invocation to speed up API response time for actual simulation requests. It may be noted that circuit simulation itself is a well known art; hence, detailed description related to circuit simulation is being omitted. Next, in operation 181, the results of the circuit simulations are stored in a non-volatile media.

Figure 6A:
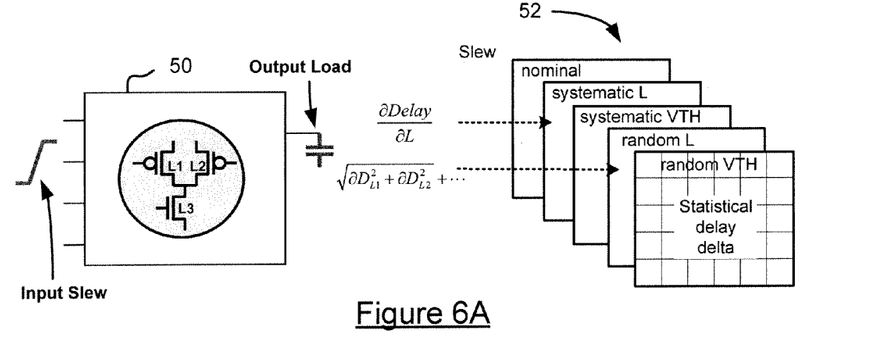
FIG. 6A illustrates an exemplary modeling the channel length and threshold voltage of transistors in a cell library through systematic and random variation parameters, in accordance with one embodiment of the invention.

Next, operation 176 is performed. In this operation a process of sensitivity characterization is performed. In one embodiment, a determination of the linearity and magnitude of influence of the process parameter tolerances on the transistors is made. The transistors that exhibit a linear influence or a substantially linear influence are simulated only once and then remaining simulation values are calculated by an extrapolation process. Hence, with the reduced number of required simulation cycles, the efficiency of the simulation is further improved substantially. To exemplary illustrate the improvement in the efficiency of the circuit simulations, suppose there are 100 transistors in a cell prior to the circuit pruning, the circuit pruning can potentially eliminate 20 transistors, thereby improving the simulation efficiency. Further, 15 out of remaining 80 transistors may potentially exhibit linear influence or substantially linear influence, hence requiring only one simulation. Therefore, only 65 transistors out of 100 are potentially needed to be simulated multiple times to capture the non-linear response. As apparent, a substantial improvement in simulation efficiency can be achieved by employing the embodiments described herein. In addition to the library characterization, voltage and temperature condition (also known as process corner), recent adoption of statistical static timing analysis (SSTA) in IC design flow requires sensitivity information for each of the data value in the library, especially in response to manufacturing process variations. In sensitivity characterization process, regular library tables of input slew and output load matrices are being supplemented with statistical library tables. The behavior of process variation may be 'systematic' or 'random'. In systematic variation, all transistors in a cell vary in unison. In random variation (also known as mismatch), each transistor's variation is independent of any other transistor inside the same cell. In FIG. 6A, transistor channel length (L) and threshold voltage (VTH) are modeled as both systematic and random variation parameters.

For systematic variations, in one embodiment, a circuit simulation is performed to determine the impact of a given parameter on the electrical behavior, such as delay, capacitance or timing constraint. The process parameter for each transistor in the cell is varied in the circuit simulation. Further, the variation may be simulated with a positive magnitude, followed by another simulation with a negative magnitude, in order to gauge the linearity of the response.

To reduce total simulation time, each process parameter's linearity is uniquely evaluated for each library table. For a process parameter with linear influence, a single circuit simulation is adequate to determine the entire range of variation. On the other hand, a process parameter determined to be non-linear must be simulated under multiple conditions over the entire range of interest. The sensitivity characterization process is discussed in details in FIGS. 6A, 8, 9A, and 9B. In operation 181, the results of sensitivity characterization are stored in a non-volatile computer readable media.

Next, the control moves to operation 168 to determine if more vectors need to be analyzed. If there are vectors remaining for analysis, operations 170 to 176 are repeated until all vectors are analyzed. Finally, the control moves to operation 178 in which a characterized circuit model is generated. Once the circuit simulations are completed, the characterized data is stored in an internal database. The saved data, or a subset of the data, the characterized data is written to an output file, such as in the Liberty™ file format or extensions to the Liberty format, depending on the user requirements. In other embodiments, the simulation models can be stored in Verilog or Vital format, or datasheets can be generated. In yet another embodiment, the format is defined by the user.

Figure 5:
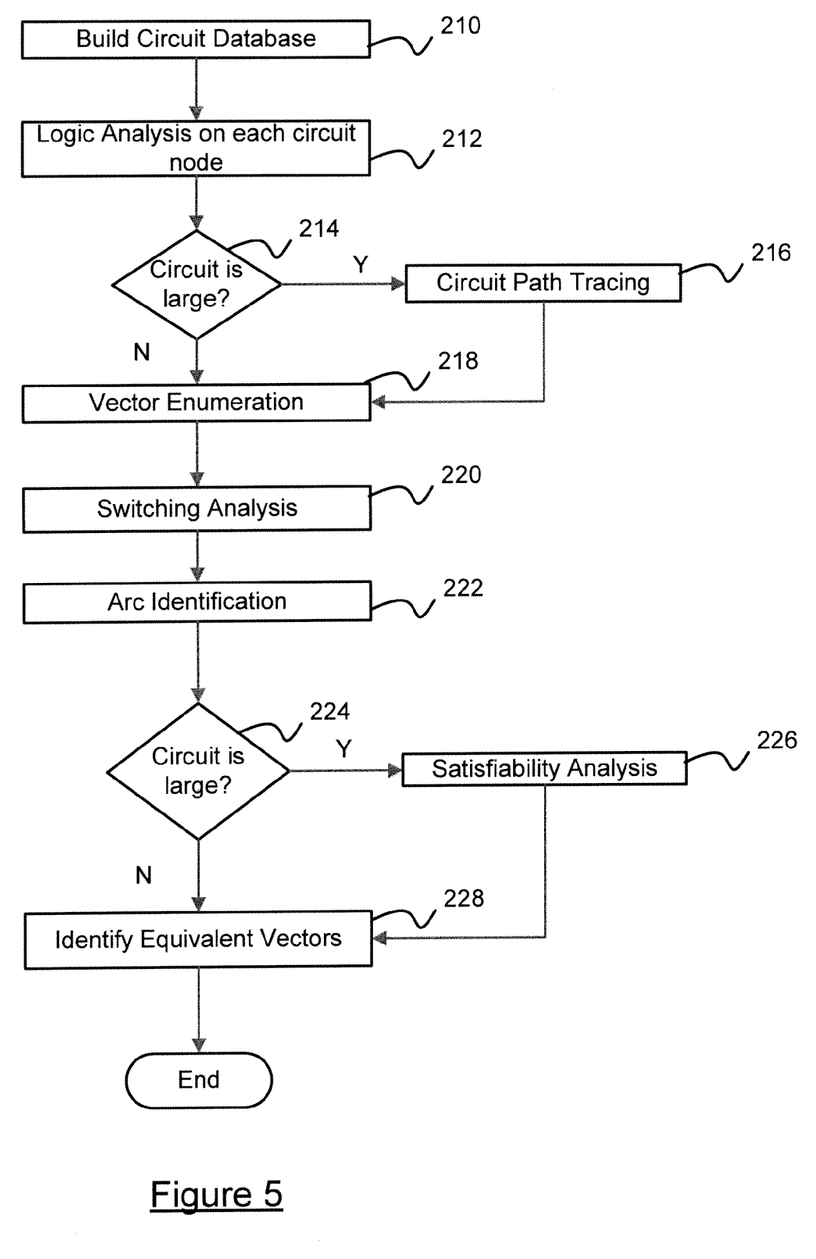
FIG. 5 illustrates a flow diagram for Arc and Vector generation, in accordance with one embodiment of the present invention.

FIG. 5 illustrates the details of the process of arc & vector determination and circuit pruning, in one embodiment. The process starts at operation 210 in which the uncharacterized circuit is read and stored in internal data structures with transistor terminals and their connectivity between each other, as well as the primary inputs and outputs of the cell or logic gate. Next, in operation 212, the transistor level circuitry is traversed to derive the logic function that result in any given node being logic "1", with connection to power supply "Vdd", or being logic "0", with connection to the ground node "Gnd". This operation is performed to optimize vector generation process because not all combinations of vectors (i.e., data words to be inputted to the cell inputs and storage nodes) may be in conformity of the logic function of the logic gate. Further, in operation 214 the size of the input circuit is analyzed. If the size of the circuit so big as the simulation time would be beyond an allowable threshold, operation 216 is performed in which the circuit path is traced, in one embodiment, through user inputs, to identify active parts of the logic gate. For example, the user may not select only a subset of arcs for the simulation. Since $2^N$ combination of input data words would be needed to perform a complete switching analysis, reducing a number of inputs may substantially reduce number of combinations. Hence, the simulation or switching analysis may be performed substantially faster.

The logic equation for each circuit node is represented as a binary decision diagram (BDD) of other circuit nodes such that their mutual logic relationship can be represented. The logic equations for all circuit nodes are combined together to represent the total logic relationship between all circuit nodes. Vectors of logic states are exhaustively enumerated from the combined BDD.

In another embodiment, it is not necessary to combine BDD equations for each and every circuit node. In this embodiment, the only point of interest lies in the circuit perturbations through the cell or logic gate. Hence, in this embodiment, the BDD equations are built for the circuit nodes that may be perturbed between a primary input and a primary output. The circuit is then traced to identify the circuit nodes between all possible paths from the input to the output. The BDD equation is built for only these circuit nodes, rather than all circuit nodes in the cell of logic gate. However, the other circuit nodes must be initialized to a logically feasible state that is consistent with the nodes along the circuit paths. To achieve such node initialization, in one embodiment, a Boolean satisfiability (SAT) solver is invoked with each logic vector enumerated from the "path BDD" together with the BDD equation of every other circuit node. The SAT solver will return a vector that is logically feasible for the entire cell, or it will return an indication that no feasible vector can be found, in which case that particular vector will be removed from further analysis. Next, the control moves to operation 218 in which all possible vectors (i.e., combination of input words and storage nodes) are enumerated. If operation 216 was performed, then all possible vectors for the selected inputs are enumerated. The control then moves to operation 220 in which a switching analysis is performed by providing stimulus to the inputs corresponding to the vectors. The switching analysis encompasses capturing circuit transitions at each node in the logic gate for a given set of inputs. Given each of the logic states in the circuit, a perturbation is applied to one or more of the inputs. The perturbation is a rising transition if the initial logic state is "0," or a falling transition if the initial logic state is "1". Once the perturbation is applied, the effects on the circuit is be propagated through the circuitry. This analysis is more efficiently performed by a switch level simulation engine. In another embodiment, a circuit simulation engine can also be used for this purpose but with much lower performance.

Still referring to FIG. 5. In operation 222, if a primary output transitions due to a primary input transition, then the arc (i.e., input-output pair) is termed as an input-to-output timing arc. The transitioning strength and the charging and discharging capacitance of every circuit node is stored for further analysis. All possible input-to-output arcs are automatically and exhaustively identified in a given circuit. Moreover, all the vectors that support each arc are identified. Timing constraint arcs between regular primary inputs and clock inputs are also identified similarly.

Next, in operation 224, a determination is made whether the input circuit is a larger circuit. The result of a similar determination in operation 214 is preserved and used in operation 224. If a determination is made that the circuit is large, the control moves to operation 226. In operation 226, a satisfiability analysis is performed. As described in operation 216, a subset of paths is selected and switching analysis is performed on the selected paths only. However, in order to verify that the circuit as a whole also conforms to the desired logic function, a satisfiability analysis is conducted on the whole circuit. In one embodiment, satisfiability analysis is performed by inputting partial vector along the path of the circuit and verifying that the entire vector conforms to the logic function implemented by the circuit. As apparent, by reducing the number of arcs for analysis and then performing the satisfiability test results in faster execution of arc and vector generation while maintaining the integrity of the logic function.

Finally, the control moves to operation 228 in which equivalent vectors are identified. Once all the arcs and vectors are identified in above operations, the redundant vectors are searched. Identifying and omitting redundant vectors, i.e., selecting substantially distinct vectors, for the circuit simulation provides good benefits because duplicate circuit simulations due can be avoided. In one embodiment, the vectors are defined to be identical when the resulting timing, delay, power and noise behaviors are identical or substantially similar within a certain user defined tolerance.

In one embodiment, to identify redundant vectors, each pair of vectors within the same arc is compared. Two vectors are electrically equivalent when every transitioning circuit node has similar pull-up or pull-down strength through the transistor circuitry, and it also has similar internal capacitance being charged up or discharged. A similar check for equivalency is performed even when an internal node does not switch all the way between power supplies, but charge shares between circuit nodes during the transition.

Figure 6B:
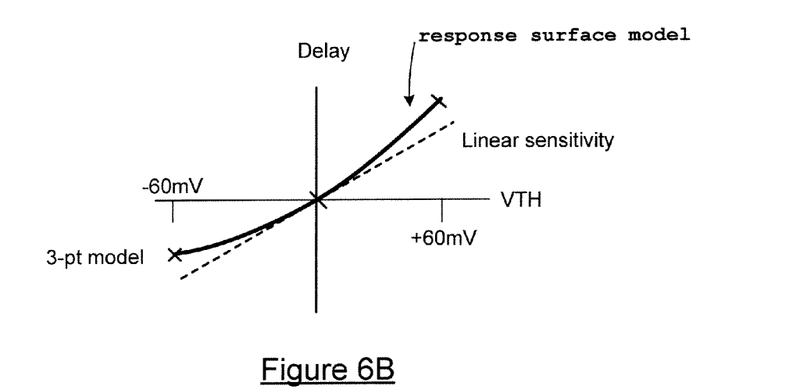
FIG. 6B illustrates an electrical response of a transistor for an exemplary process parameter, in accordance with one embodiment of the present invention.

FIG. 6A illustrates an overview diagram of modeling the transistor channel length (L) and threshold voltage (VTH) for the transistors in a logic gate 50. It may be noted that fabricating same logic gates in different fabrication facilities results in the transistors having different behavioral characteristics. Hence, this modeling is important to predict transistor behavior for systematic and random process variations. In systematic process variation, all transistors in a logic gate vary in unison. In random process variation, each transistor's behavior is independent of any other transistor inside the same logic gate 50. The impact of a process parameter 52 on a logic gate's 50 input to output delay, setup and hold timing constraint, pin capacitance, dynamic and leakage power consumption is a non-linear function of the variation. FIG. 6B illustrates a non-linear influence of the process parameter VTH on input to output delay.

Due to the non-linearity of the impact of the changing process variables, it may require to simulate the circuit for many times to accurately characterize the electrical response to a particular process parameter variation. To reduce total simulation time, each process parameter's linearity and magnitude of influence on a transistor is uniquely evaluated. If the influence on a transistor determined to be non-linear must be simulated under multiple conditions over the entire process parameter variation range of interest (i.e., for entire range of variation in the values of the process parameters). On the other hand, if the influence on a transistor determined linear and small influence, a single circuit simulation or simulation on a subset of the entire process parameter variation range is adequate to determine the entire range of variation using an interpolation/extrapolation process including a response surface method (RSM). Whether the influence is "large" or "small", in one embodiment, defined by selecting a threshold value of the influence delta. A value of the influence delta (i.e., difference of values at two points on the curve 47) is small is below the threshold value.

Figure 7A:
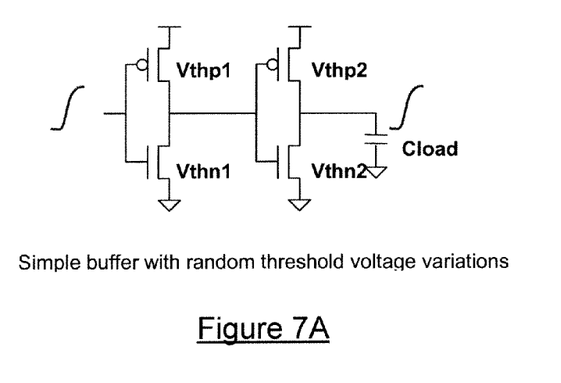
FIGS. 7A and 7B illustrate a simplified schematic diagram showing a plurality of transistors for random variation parameter modeling and a sparse table including exemplary measurements of threshold voltage, pin capacitance, etc., of each transistor, in accordance with one embodiment of the invention.
Figure 7B:
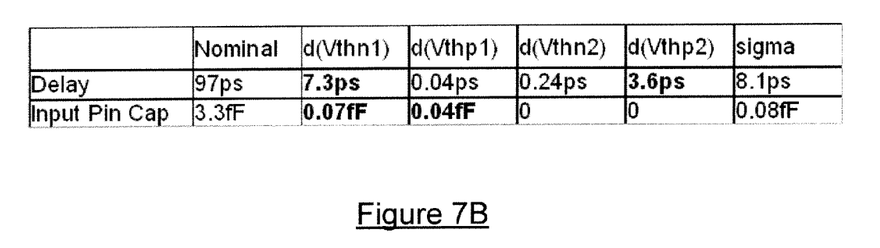

FIGS. 7A and 7B show an exemplary logic circuit having a plurality of transistors and a table including delay and input pin capacitance for various threshold voltages. In one embodiment, the process parameter that is modeled for random variation must be evaluated for each transistor inside the logic gate. As apparent from data in FIG. 7B, the influence on each transistor, i.e. delay, is unique within a given electrical behavior. In addition, the influence is also unique between different electrical behaviors, such as between cell delay and pin capacitance. In the exemplary data in FIG. 7B, it is apparent that the influence of Vthp1 (threshold voltage) is large on pin capacitance but small on delay. Conversely, the influence of Vthp2 is non-existent on pin capacitance but large on delay.

Once the influence of each transistor is determined, the transistors are sorted in decreasing order of influence. The transistor with most influence must be simulated with the highest library table accuracy, whereas transistors with lesser influence can be simulated with partial table values, with the remaining of the table values predicted with a surface projection technique.

Figure 8:
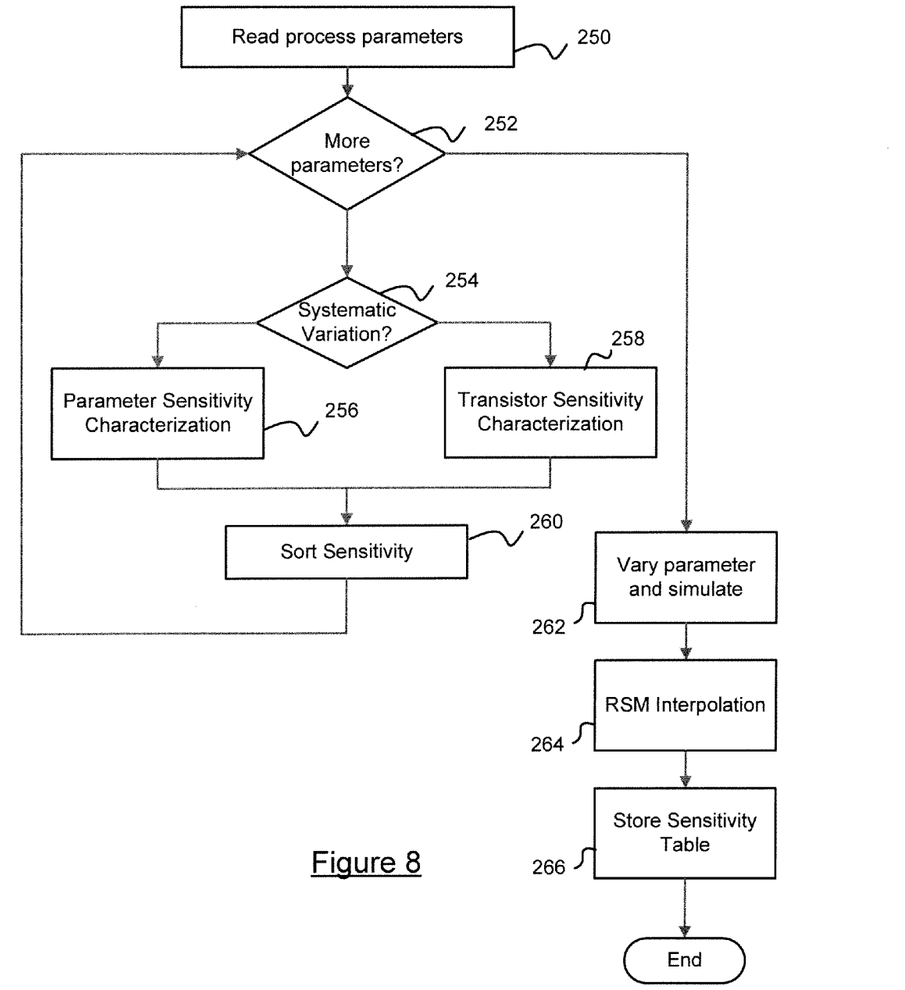
FIG. 8 illustrates a flow diagram for sensitivity characterization process, in accordance with one embodiment of the present invention

Moving now to FIG. 8 which illustrates a process of sensitivity analysis in one embodiment. In operation 250 the process parameters for which the sensitivity analysis is to be performed are read. In one embodiment, a list of process parameters to be analyzed is provided, either by the user or by the process model file. Next, in operation 252, a loop is built to iteratively act on input parameters, one parameter at a time. In operation 254, identification is made whether the input parameter is modeled for a systematic variation or a random variation. In systematic variation, all transistors in a cell vary in unison. In random variation (also known as mismatch), each transistor's variation is independent of any other transistor inside the same cell or logic gate.

Next, if the parameter is modeled for a systematic variation 256, a circuit simulation is performed to determine the impact of a given parameter on the electrical behavior, such as delay, capacitance or timing constraint. The process parameter for each transistor in the cell is varied in the circuit simulation. Further, the variation may be simulated with a positive magnitude, followed by another simulation with a negative magnitude, in order to gauge the linearity of the response.

To reduce total simulation time, each process parameter's linearity is uniquely evaluated for each library table. For a process parameter with linear influence, a single circuit simulation is adequate to determine the entire range of variation. On the other hand, a process parameter determined to be non-linear must be simulated under multiple conditions over the entire range of interest.

In operation 258, a process parameter that is modeled for random variation is evaluated for each transistor inside a cell or logic gate. As shown in FIG. 3B, the influence of each transistor is unique within a given electrical behavior. In addition, the influence is also unique between different electrical behaviors, such as between cell delay and pin capacitance. In the example shown in FIG. 7B, the influence of Vthp1 is large on pin capacitance but small on delay. Conversely, the influence of Vthp2 is non-existent on pin capacitance but large on delay. The overall influence of a given transistor must be determined considering all electrical characteristics pertaining to the particular library table.

Once the influence of each transistor is determined, in operation 260 the transistors are sorted in decreasing order of influence. For systematic variation, the sorting is performed on all the given parameters. For random variation, the sorting is performed on each transistor in the cell or logic gate. In operation 262, the parameter or transistor with most influence are simulated with highest library table accuracy, whereas transistors with lesser influence can be simulated with partial table values, with the rest of the table values predicted with a response surface model (RSM) in operation 264. The RSM method is described in details in FIGS. 9A and 9B. Finally, in operation 266, the sensitivity table values are stored in the library storage to be used in the circuit simulation and model generation.

Figure 9A:
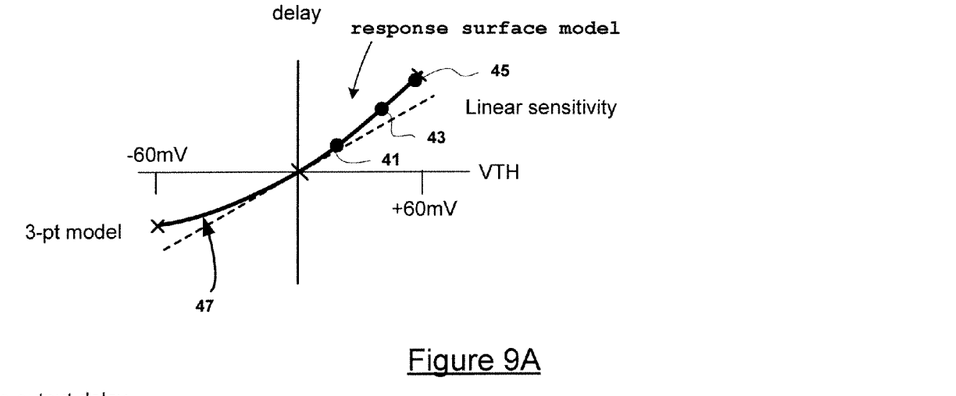
FIG. 9A illustrates an electrical response of a transistor for an exemplary process parameter, in accordance with one embodiment of the present invention.
Figure 9B:
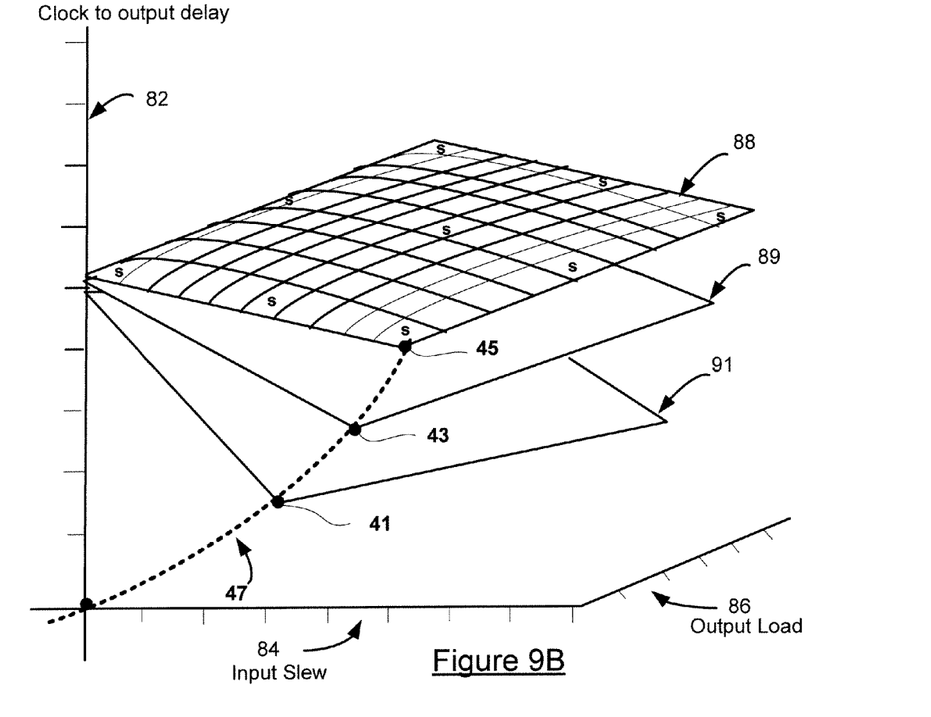
FIG. 9B illustrates exemplary library table surfaces to be used in the Response Surface Method, in accordance with one embodiment of the present invention

FIG. 9A shows an exemplary electrical influence of VTH process parameter on a transistor. On response surface model curve 47, three points 41, 43, 45 are marked for providing correlation with the response surface model illustrated in FIG. 9B. FIG. 9B shows the library table surfaces 88, 89, 91 due to the influence of each transistor inside a 24-transistor D-flip flop. A cell library consists of multi-dimensional tables of cell delay, power and noise. Common table dimensions are input slew rate and output loading capacitance value. These tables are commonly known as non-linear delay model (NLDM) or non-linear power model (NLPM). It is well known that the input slew and output load surface is unique between different logic cells, and even between different timing arcs within the same logic cell. The horizontal axes are input slew and output load ranges, and the vertical axis is the CLOCK to OUTPUT delay of the D-flip flop. The relative surface shape is similar for each of the transistor variation within the same timing arc. Due to the similarity of the variation response surfaces 88, 89, 91, modeling the difference between these surfaces result in a much more linear response surface model. A more linear RSM will result in higher interpolation or extrapolation accuracy. Due to relatively similar surface shapes, the surface projection technique can accurately predict the sparse table values by approximating same relative curvature between any two points in the nominal surface and the process variation surface. The accuracy of simulation is not compromised by this approximation because the surface projection technique is applied only to the transistors with small electrical influence.

Still referring to FIG. 9B, If the delay is linear and variation (or delta delay, i.e., difference of delay value between two points on the curve 47) influence is small, in one embodiment, only one circuit simulation is sufficient. In one example, one circuit simulation as represented by point 41 on the curve 47 is sufficient if the influence is small and linear. Whether the influence is "large" or "small", in one embodiment, defined by selecting a threshold value of the influence delta (i.e. delta delay). In one example, if a default threshold value is 65% is selected, the default threshold value of 65% would mean that the cumulative delay impact from the subset of transistors with strongest influence must exceed 65% of the total impact from all transistors. In this example, the sorted subset of transistors with influence exceeding 65% requires full table simulation and each of the rest of the transistors only require partial table simulation. In one embodiment, the threshold value is user selectable. In another embodiment, a mean or a median value may serve as the threshold value. Further, if the curve 47 is substantially linear and the delay delta (i.e., difference between values of influence at two places on the curve 47) influence is small, the simulation does not need to be performed on the whole table of input slew and output load (represented by surface 88, 89, 91). A sparse table interpolation method (described in details hereinafter) is used to determine delay values for the remaining values of input slew/output load. Hence, each of the transistor induced variation surfaces only requires a sparse table, with the rest of the table values fill in by interpolation using the RSM model.

For example, if the original (nominal condition) table consists of seven input slews and seven output loads, or forty nine table values in total. However, each of the variation tables can be modeled with only three input slews and three output loads, or nine table values in total. The rest of the table values are interpolated. This methods reduces the number of circuit simulations, by a factor of 49/9=5.4 times in the above example. Since the response surface model interpolation is applied only to transistor surfaces with lesser influence, the overall accuracy loss is even less. However, for non-linear responses, or responses with large delay influence delta, multiple simulations may need to be performed using all values of input slew and output load. For example, for a transistor with large or non-linear influence, simulation at points 41, 43, and 45 including all values of input slew and output load (exemplarily represented by 10×9 input slew/output load matrix on surface 88).

The Response Surface Method (RSM) can be used in conjunction with the circuit pruning to greatly improve the simulation efficiency of the circuit. In one embodiment, the number of simulations required to cover the range of input slew and output load are reduced through the RSM. The RSM method, in one embodiment, is employed to reduce number of circuit simulation over the entire table of slew and output load if the delta influence of the process parameter is small and the curve 47 is substantially linear. The library characterization process often involves two dimensional tables of delay due to varying input slew (input slew is defined as the amount of time it takes for an input to swing from Ground to Supply) and output load (as illustrated in FIG. 9B). For example, the two dimensional table may have the following table indices:

input slew: 1 ps, 2 ps, 5 ps, 10 ps, 20 ps, 50 ps, 100 ps, 200 ps, 500 ps, 1000 ps output load: 1 ff, 2 ff, 5 ff, 10 ff, 20 ff, 40 ff, 80 ff, 160 ff, 320 ff (ps=pico-seconds, ff=femto-Farads of output capacitance)

Above example describes a 10×9 table of delays (exemplarily represented by 10×9 matrix on surface 88). However, instead of performing ninety simulations, one for each input slew-output load combination, a sparse table is chosen from the table of delays. For example, the following sparse table may be selected:

Input slew: 1 ps, 50 ps, 1000 ps
Output load: 1 ff, 20 ff, 320 ff

As apparent, a 3×3 matrix is selected from the corner indices as well as a middle index of 10×9 table above. Hence, instead of performing ninety simulations, only 3×3=9 simulations (exemplarily represented by letter "S" on surface 88) are performed. The remaining values are calculated with the RSM model (exemplary RSM model is illustrated in FIG. 9) from these nine simulations.

Figure 10:
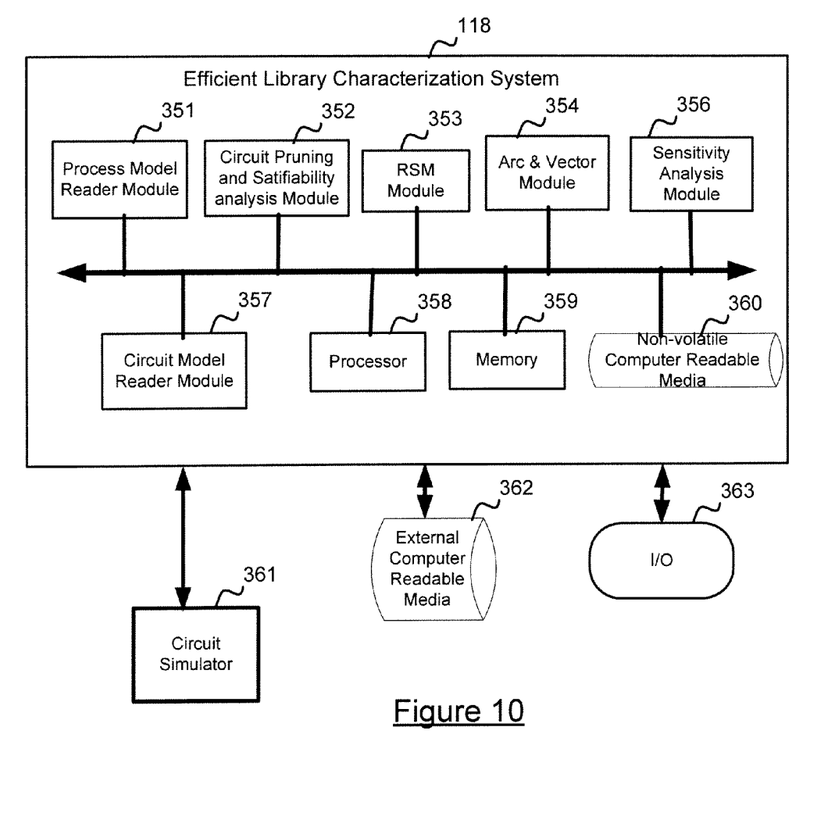
FIG. 10 illustrates an exemplary library characterization system, in accordance with one embodiment of the present invention.

Referring now to FIG. 10 which illustrates an exemplary efficient library characterization system 118. The efficient library characterization system includes a processor 358 to execute programming instructions and enabling communication and data transfer among various internal and external modules and resources. The efficient library characterization system 118 further includes a circuit and process model reader module 351 for reading library cell netlists and process modules, a circuit pruning and satisfiability analysis module 352 to prune the circuit and to verify the logic function of the circuit, an RSM module to perform RSM interpolation, building sparse table, and performing interpolations. The efficient library characterization system 118 also includes a arc & vector module 354 to determine arcs and vectors in the circuit, a sensitivity analysis module 356 to perform sensitivity analysis on the circuit, a circuit model reader module 357 to interface with the SPICE simulator 361 for reading the circuit models as well as invoking circuit simulations in the circuit simulator 361. The efficient library characterization system 118 includes memory 359 for storing processing results and aiding the processor 358 in the execution of programming instructions, and a non-volatile computer readable media to store simulation results as wells are outputs from various internal modules. The efficient library characterization system 118 further includes I/O interface 363 to enable inputting user commands as well as providing a communication interface to external systems. In one embodiment, the efficient library characterization system 118 further includes an interface to external computer readable media 362 for storing data and simulation results.

In one embodiment, the various modules as illustrated in FIG. 10 are implemented in hardware. In another embodiment, these modules are implemented in software. In yet another embodiment, these modules are implemented in a combination of hardware and software. The computer readable media 362, in one embodiment, includes programming instructions, which when executed by the processor 358, implements these modules. The computer readable media 362 includes non-volatile computer readable media.

With the above embodiments in mind, it should be understood that the invention may employ various computer-implemented operations involving data stored in computer systems. These operations include operations requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The above described invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a communications network.

The invention can also be embodied as computer readable code on a computer readable medium. The computer readable medium is any data storage device that can store data which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method of efficient library characterization of a circuit of a logic gate having a plurality of transistors and a plurality of nodes defining interconnection points in the circuit, comprising:
   (a) determining a plurality of vectors for a plurality of arcs, each of the plurality of vectors represents possible data bits to inputs and nodes of the logic gate;
   (b) selecting a plurality of substantially distinct vectors from the plurality of vectors for each of the plurality of arcs;
   (c) performing circuit pruning for each of the plurality of substantially distinct vectors taking each one substantially distinct vector at a time, the circuit pruning includes identifying an active circuit for each vector, the active circuit is identified by determining which circuit features are activated when applying a particular one of the substantially distinct vectors, wherein performing includes identifying one or more inactive nodes by performing a single circuit simulation to capture a switching behavior of the plurality of nodes;
   (d) performing circuit simulations limited to a plurality of transistors in the active circuit;
   (e) repeating (c) and (d) for remaining ones of the plurality of substantially distinct vectors; and
   (f) storing results of the circuit simulations on a non-volatile compute readable media, for each active circuit corresponding to each of the plurality of substantially distinct vectors.

2. The method as recited in claim 1, wherein selecting a plurality of substantially distinct vectors further includes determining a switching characteristic of each of the plurality of transistors in each of the plurality of arcs corresponding to each of the plurality of substantially distinct vectors by applying stimulus to inputs of the logic gate and measuring a charging and discharging capacitance of each of the plurality of nodes in a path of the each of the plurality of arcs.

3. The method of claim 1, wherein performing circuit simulations further includes performing sensitivity analysis, the sensitivity analysis includes determining a linearity of an electrical response of a process parameter variation on each of the transistors in each of the plurality of arcs.

4. The method of claim 3, wherein the sensitivity analysis further includes determining a magnitude of the electrical response of a process parameter variation on each of the transistors in the each of the plurality of arcs.

5. The method of claim 4, wherein the sensitivity analysis further includes performing a response surface method (RSM), the RSM including:
- identifying a plurality of transistors in the active circuit that exhibit a linear and small electrical influence of the process parameter variation, the electrical influence being measured by applying the process parameter variation to the circuit and analyzing a change in the electrical influence of each of the plurality of transistors, the small and linear electrical influence is characterized by a substantially linear change in the electrical influence and a magnitude of the electrical influence below a selectable threshold; and
- modeling a surface response for each of the plurality of transistors using a sparse table and a interpolation process to reduce a number of circuit simulations, the sparse table includes a subset of values of an RSM simulation table of delays, the RSM simulation table of delays includes a plurality of input slew and output load values.

6. The method as recited in claim 5, wherein the sparse table includes a subset of the plurality of input slew and output load values selected from a user selectable portions of the RSM simulation table.

7. The method as recited in claim 5, wherein the sparse table includes a subset of the plurality of input slew and output load values selected from the left portion, middle portion, and right portion or other portions of the RSM simulation table.

8. The method of claim 1, wherein performing circuit simulations further includes performing satisfiability analysis on the logic gate, the satisfiability analysis includes verifying logic functions of the logic gate and the satisfiability analysis being performed on the all inputs and internal nodes of the logic gate.

9. The method of claim 8, wherein performing of the satisfiability analysis further includes inputting a partial vector along a path of the circuit and verifying that an entire vector conforms to a logic function implemented by the circuit.

10. An apparatus for performing an efficient library characterization process on a circuit of a logic gate having a plurality of transistors and a plurality of nodes defining interconnection points in the circuit, comprising:
- a processor configured to execute one or more modules, said modules including:
- a module to read process models that describe process variations data, the process models being used to predict influence on a switching characteristics through circuit simulations and a Response Surface Method (RSM);
- a module to enable a user to input user commands;
- a module to determine a plurality of arcs, each of the plurality of arcs represents an input-to-output path pair in the logic gate, and determining a plurality of vectors for each of the plurality of arcs, each of the plurality of vectors represents a possible input data bits to inputs and the plurality of nodes; and
- a module to perform circuit pruning process, the circuit pruning process includes identifying active portions of the circuit, the active portions being portions of the circuit that affect circuit performance, wherein the circuit pruning process includes identifying one or more inactive nodes by performing a single circuit simulation to capture a switching behavior of the plurality of nodes, wherein, the circuit simulation is run to predict process variation influence on a switching characteristic on a plurality of transistors in a pruned circuit.

11. The apparatus as recited in claim 10, further comprises a module to analyze each of the plurality of arcs through a path tracing method, the path tracing method includes determining a switching characteristic of each of the plurality of transistors in the each of the plurality of arcs using only a subset of the plurality of vectors in the circuit.

12. The apparatus as recited in claim 10, further comprises a module to perform a satisfiability analysis on the logic gate, the satisfiability analysis includes verifying logic functions of the logic gate.

13. The apparatus as recited in claim 10, wherein the module to perform circuit simulation includes a low level Application Program Interface (API) to a circuit simulator that produces the circuit simulation result without requiring a file exchange and without requiring the invocation of a separate circuit simulation.

14. A non-transitory computer readable media having program instructions for efficient library characterization of a circuit of a logic gate having a plurality of transistors and a plurality of nodes defining interconnection points in the circuit, the computer readable media comprising:
- (a) program instructions for determining a plurality of vectors for a plurality of arcs, each of the plurality of vectors represents possible data bits to inputs and nodes of the logic gate;
- (b) program instructions for selecting a plurality of substantially distinct vectors from the plurality of vectors for each of the plurality of arcs;
- (c) program instructions for performing circuit pruning for each of the plurality of substantially distinct vectors taking each one substantially distinct vector at a time, the circuit pruning includes identifying an active circuit for each vector, the active circuit is identified by determining which circuit features are activated when applying a particular one of the substantially distinct vectors, wherein performing includes identifying one or more inactive nodes by performing a single circuit simulation to capture a switching behavior of the plurality of nodes;
- (d) program instructions for performing circuit simulations limited to a plurality of transistors in the active circuit;
- (e) program instructions for repeating (c) and (d) for remaining ones of the plurality of substantially distinct vectors; and
- (f) program instructions for storing results of the circuit simulations on a readable media, for each active circuit corresponding to each of the plurality of substantially distinct vectors.

15. The computer readable media of claim 14, wherein the program instructions for selecting a plurality of substantially distinct vectors further includes,
- program instructions for determining a switching characteristic of each of the plurality of transistors in each of the plurality of arcs corresponding to each of the plurality of substantially distinct vectors by applying stimulus to inputs of the logic gate and measuring a charging and discharging capacitance of each of the plurality of nodes in a path of the each of the plurality of arcs.

16. The computer readable media of claim 14, wherein the program instructions for performing circuit simulations further includes,
- program instructions for performing sensitivity analysis, the sensitivity analysis includes determining a linearity of an electrical response of a process parameter variation on each of the transistors in each of the plurality of arcs.

\* \* \* \* \*